US009564865B2

(12) United States Patent
Kusu et al.

(10) Patent No.: US 9,564,865 B2
(45) Date of Patent: Feb. 7, 2017

(54) REDUNDANT AMPLIFIER AND SWITCHING METHOD THEREOF

(71) Applicants: Tomomichi Kusu, Tokyo (JP); Ikuo Hosoda, Tokyo (JP)

(72) Inventors: Tomomichi Kusu, Tokyo (JP); Ikuo Hosoda, Tokyo (JP)

(73) Assignee: NEC Space Technologies, Ltd., Tokyo (JP)

( * ) Notice: Subject to any disclaimer, the term of this patent is extended or adjusted under 35 U.S.C. 154(b) by 0 days.

(21) Appl. No.: 14/347,997

(22) PCT Filed: Sep. 19, 2012

(86) PCT No.: PCT/JP2012/074604
§ 371 (c)(1),
(2) Date: Mar. 27, 2014

(87) PCT Pub. No.: WO2013/047540
PCT Pub. Date: Apr. 4, 2013

(65) Prior Publication Data
US 2014/0225666 A1    Aug. 14, 2014

(30) Foreign Application Priority Data

Sep. 30, 2011  (JP) .................................. 2011-217346

(51) Int. Cl.
*H03F 3/68*    (2006.01)
*H03F 1/02*    (2006.01)
(Continued)

(52) U.S. Cl.
CPC .............. *H03F 3/68* (2013.01); *H03F 1/0277* (2013.01); *H03F 3/189* (2013.01); *H03F 3/245* (2013.01);
(Continued)

(58) Field of Classification Search
CPC ......... H03F 3/68; H03F 2200/414; H01P 1/10
(Continued)

(56) References Cited

U.S. PATENT DOCUMENTS

| 4,644,301 A | 2/1987 | Hecht |
| 5,828,568 A | 10/1998 | Sunakawa et al. |

(Continued)

FOREIGN PATENT DOCUMENTS

| EP | 2259446 A1 | 12/2010 |
| JP | A-H04-332209 | 11/1992 |

(Continued)

OTHER PUBLICATIONS

International Search Report corresponding to International Application No. PCT/JP2012/074604, Nov. 27, 2012, 3 pages.

(Continued)

*Primary Examiner* — Steven J. Mottola
*Assistant Examiner* — Hafizur Rahman
(74) *Attorney, Agent, or Firm* — Wilmer Cutler Pickering Hale and Dorr LLP

(57) ABSTRACT

Provided is a redundant amplifier, including: a first switch for connecting, on a one-to-one basis, inputs P1 to Pm to m of outputs Q1 to Qn, where m and n are natural numbers and m<n is satisfied; a second switch for connecting, on a one-to-one basis, m of inputs R1 to Rn to m outputs S1 to Sm; and amplifiers A1 to An connected on a one-to-one basis between the outputs Q1 to Qn and the inputs R1 to Rn. Signal paths L1 to Lm are formed in accordance with a connection state between an input and an output of each of the first switch and the second switch, the signal paths L1 to Lm connecting the input P1 and the output S1, the input P2 and the output S2, . . . , and the input Pm and the output Sm, respectively, via any one of the amplifiers A1 to An. The (Continued)

connection state has at least two types in which the signal paths L1 to Lm each have the same length.

8 Claims, 14 Drawing Sheets

(51) Int. Cl.
 H03F 3/189 (2006.01)
 H03F 3/24 (2006.01)
 H03F 3/72 (2006.01)
 H03F 3/60 (2006.01)
 H04B 1/74 (2006.01)
(52) U.S. Cl.
 CPC ............... *H03F 3/602* (2013.01); *H03F 3/72* (2013.01); *H03F 2200/249* (2013.01); *H03F 2200/414* (2013.01); *H03F 2203/7215* (2013.01); *H03F 2203/7221* (2013.01); *H03F 2203/7236* (2013.01); *H04B 1/74* (2013.01)
(58) Field of Classification Search
 USPC ........... 330/124 D, 124 R, 101, 105, 51, 295
 See application file for complete search history.

(56) References Cited

U.S. PATENT DOCUMENTS

| | | | |
|---|---|---|---|
| 6,020,796 A * | 2/2000 | Collar | H04B 7/2045 333/101 |
| 6,943,625 B2 * | 9/2005 | Lane et al. | 330/124 D |
| 2004/0014500 A1 | 1/2004 | Chun | |
| 2005/0110564 A1 | 5/2005 | Lane et al. | |
| 2011/0012675 A1 | 1/2011 | Machino | |

FOREIGN PATENT DOCUMENTS

| | | |
|---|---|---|
| JP | 2010161711 A * | 7/2010 |
| JP | A-2010-161711 | 7/2010 |

OTHER PUBLICATIONS

Chan, K. Y. et al., "Monolithic MEMS T-type Switch for Redundancy Switch Matrix Applications," Proceedings of the 38th European Microwave Conference, Amsterdam, The Netherlands, pp. 1513-1516 (Oct. 2008).

Daneshmand, M. and Mansour, R. R., "RF MEMS Satellite Switch Matrices," IEEE Microwave Magazine, pp. 92-109 (Aug. 2011).

Daneshmand, M. et al., "Redundancy RF MEMS Multiport Switches and Switch Matrices," Journal of Microelectromechanical Systems, vol. 16, No. 2, pp. 296-303 (Apr. 2007).

Partial Supplementary European Search Report issued by the European Patent Office for Application No. 12835100.4 dated May 4, 2015 (7 pages).

Extended European Search Report corresponding to European Application No. 12835100.4, dated Oct. 9, 2015, 12 pages.

* cited by examiner

MODE 1

MODE 2

MODE 1

MODE 2

MODE 3

MODE 4

REDUNDANT AMPLIFIER AND SWITCHING METHOD THEREOF

CROSS-REFERENCE TO RELATED APPLICATIONS

The present application is a national stage application of International Application No. PCT/JP2012/074604 entitled "Redundant Amplifier and Switching Method Thereof," filed on Sep. 19, 2012, which claims the benefit of priority from Japanese Patent Application No. JP2011-217346, filed on Sep. 30, 2011, the disclosures of which are incorporated herein in their entirety by reference thereto.

TECHNICAL FIELD

This invention relates to a redundant configuration for amplifiers, and more particularly, to a redundant configuration for amplifiers in a multi-port amplifier (MPA).

BACKGROUND ART

An MPA is an amplifier that enables output of several hundred to several thousand watts by combining high-frequency signals amplified by a plurality of amplifiers, and is used in systems for transmitting radio waves, such as an electrical communication system and a radar system. The MPA is mounted also on "KIZUNA (WINDS)" satellite, which is in service on orbit as of 2011. By mounting the MPA on a satellite, an antenna beam may be spread without a drive portion. In such satellites and spacecraft, however, high reliability is particularly required for the MPA. Further, the number of redundant amplifiers is limited in view of resource problems.

When high reliability is required for the MPA, it is important to secure reliability in an amplifier part constituting the MPA. Redundancy is one method for improving the reliability. In a system including a plurality of devices of a similar type, such as the MPA, it may be considered to design the devices to have a redundant configuration so that, even when a problem occurs in any of active devices, switching to a stand-by device is perforated to maintain the function of the system. As a simple redundant configuration, one that prepares stand-by devices for all of the active devices may be considered, but such a configuration requires twice as many devices as the active devices, which is not preferred considering resource problems.

Besides, there may be considered a configuration in which stand-by devices fewer than active devices are prepared and a connection to an active device having a problem is switched to connection to a stand-by device. In this case, because the active device having a problem cannot be specified before the problem occurs, the stand-by device is required to be substitutable no matter which active device fails.

On the other hand, there is considered a case where an RF signal is divided into a plurality of RF signals by a divider or the like, and the respective divided RF signals are amplified by the MPA and combined by a combiner. At this time, the plurality of RF signals, which has input to the combiner, are each required to have the same amplitude and phase. When the amplifiers are designed to have a redundant configuration, the outputs are each required to have the same amplitude and phase not only when the outputs of the active amplifiers are compared to each other, but also even after a part of the active amplifiers is switched to the stand-by amplifier.

Patent Literature 1 describes a technology involving appropriately determining the electric length of a connection path so as to match a phase obtained through passage of a connection path passing through an active system amplifier with a phase obtained through passage of a connection path passing through a stand-by system amplifier. In this technology, the path length is determined based on the electric length, and hence the effect can be obtained only when a signal having a specific wavelength is input. The effect cannot be obtained when a signal having a wavelength other than the specific wavelength is input.

CITATION LIST

Patent Literature

Patent Literature 1: JP-A-H04-332209

DISCLOSURE OF THE INVENTION

Problem to be Solved by the Invention

This invention has been made in view of such circumstances, and it is an object of this invention to provide a redundant amplifier in which any active amplifier is substitutable with a stand-by amplifier, and the same amplitude and phase are obtained among outputs of the amplifiers in both before and after switching from an active system to a stand-by system, the redundant amplifier being independent of the amplitude of an input signal.

Means to Solve the Problem

In order to achieve the above-mentioned object, according to one aspect of the present invention, there is provided a redundant amplifier, including: a first switch including inputs P1, P2, . . . , and Pm and outputs Q1, Q2, . . . , and Qn, where m and n are natural numbers and m<n is satisfied, the first switch being configured to perform switching of connecting, on a one-to-one basis, the in inputs P1, P2, . . . , and Pm to m of the n outputs Q1, Q2, . . . , and Qn; a second switch including inputs R1, R2, . . . , and Rn and outputs S1, S2, . . . , and Sm, the second switch being configured to perform switching of connecting, on a one-to-one basis, of the n inputs R1, R2, . . . , and Rn to the m outputs S1, S2, . . . , and Sm; and n same amplifiers A1, A2, . . . , and An connected on a one-to-one basis between the n outputs Q1, Q2, . . . , and Qn of the first switch and the n inputs R1, R2, . . . , and Rn of the second switch, in which signal paths L1, L2, . . . , and Lm are formed in accordance with a connection state between an input and an output of each of the first switch and the second switch, the signal paths L1, L2, . . . , and Lm connecting the input P1 and the output S1, the input P2 and the output S2, . . . , and the input Pm and the output Sm, respectively, via any one of the n same amplifiers A1, A2, . . . , and An, and in which the connection state has at least two types in which the signal paths L1, L2, . . . , and Lm each have the same length.

Further, according to another aspect of the present invention, there is provided a switching method for a redundant amplifier, including the steps of: outputting m signals simultaneously input to a first switch from m outputs of a second switch, where m and n are natural numbers and m<n is satisfied, the m signals passing through a first signal path group including in signal paths that each have the same first path length and each pass through any one of predetermined in active system amplifiers of n amplifiers; changing, when a problem occurs in at least one of the in active system amplifiers, a connection state between an input and an output of each of the first switch and the second switch, to thereby from a second signal path group including m signal paths that each have the same second path length and each pass through any one of active system amplifiers without a problem of the predetermined in active system amplifiers and predetermined (n−m) redundant system amplifiers of the n amplifiers; and outputting in signals simultaneously input to the first switch from the respective m outputs of the second switch, the in signals passing through the second signal path group.

Effect of the Invention

According to this invention, the signal paths of outputs, which pass through active amplifiers (active system amplifiers) before redundant switching, each have the same signal path length. Further, the signal paths of outputs, which pass through active amplifiers (active system amplifiers without problems and stand-by system amplifier) when a problem occurs in any of the active system amplifiers and after the stand-by system amplifier is enabled to be used instead of the failed amplifier, each also have the same signal path length. Therefore, whether before or after the redundant switching, the signal paths passing through the active amplifiers each have the same length, and hence whether before or after the redundant switching, the outputs of the amplifiers each have the same amplitude and phase.

MODE FOR EMBODYING THE INVENTION

Figure 1:
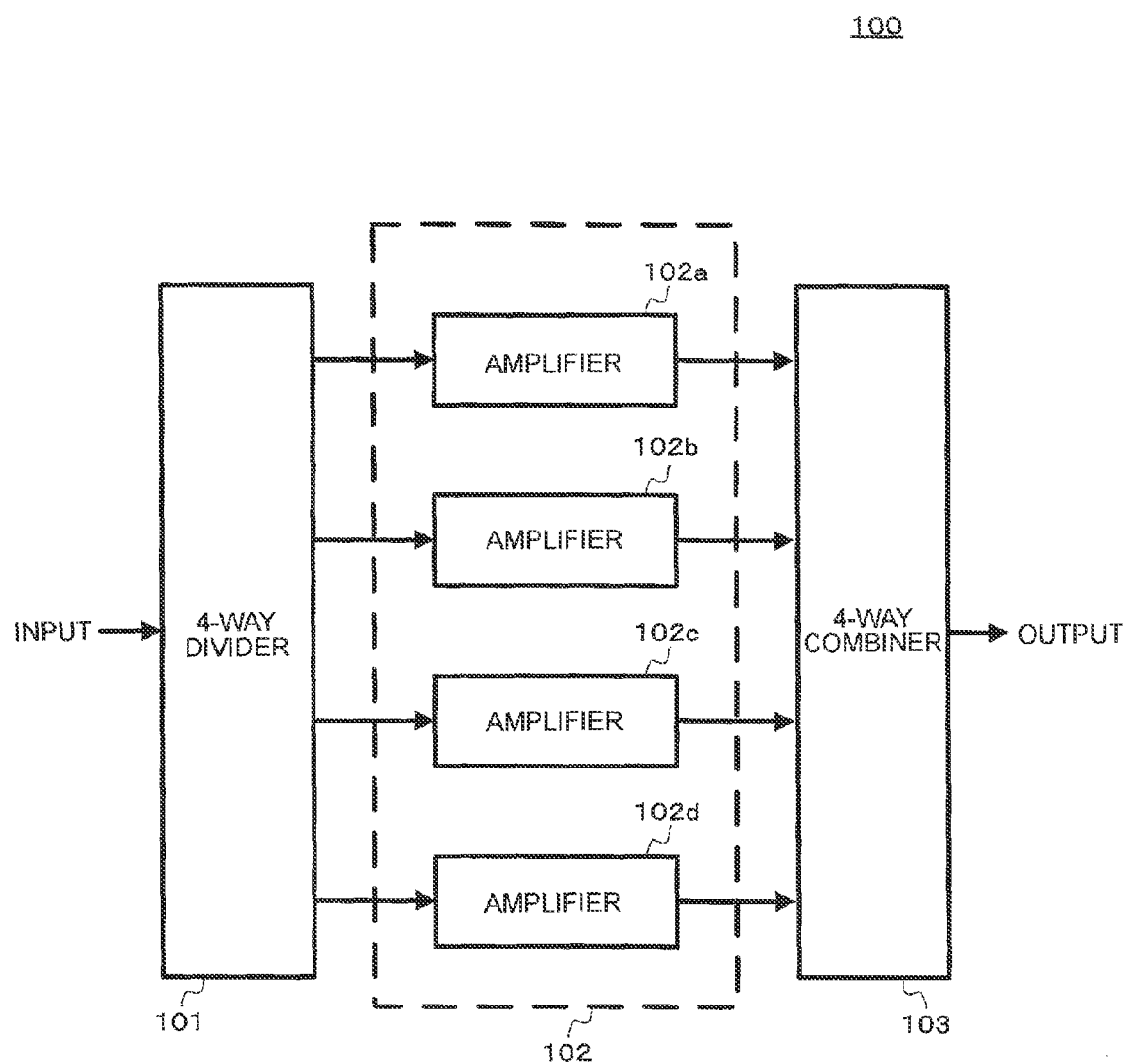
FIG. 1 is a block diagram of a signal amplifier 100 including amplifiers having a non-redundant configuration.

First, for comparison, a conventional signal amplifying device 100 is described with reference to FIG. 1. The signal amplifying device 100 includes a divider 101 for dividing an input signal into four signals, an amplifier 102, and a combiner 103 for combining four input signals into one signal. The amplifier 102 has a non-redundant configuration, and is an MPA including four amplifiers 102a, 102b, 102c, and 102d for amplifying the respective four signals. The four outputs of the divider 101 and the respective inputs of the four amplifiers 102a to 102d are directly connected to each other on a one-to-one basis. The same applies to connection between the respective outputs of the four amplifiers and the four inputs of the combiner 103.

Figure 2:
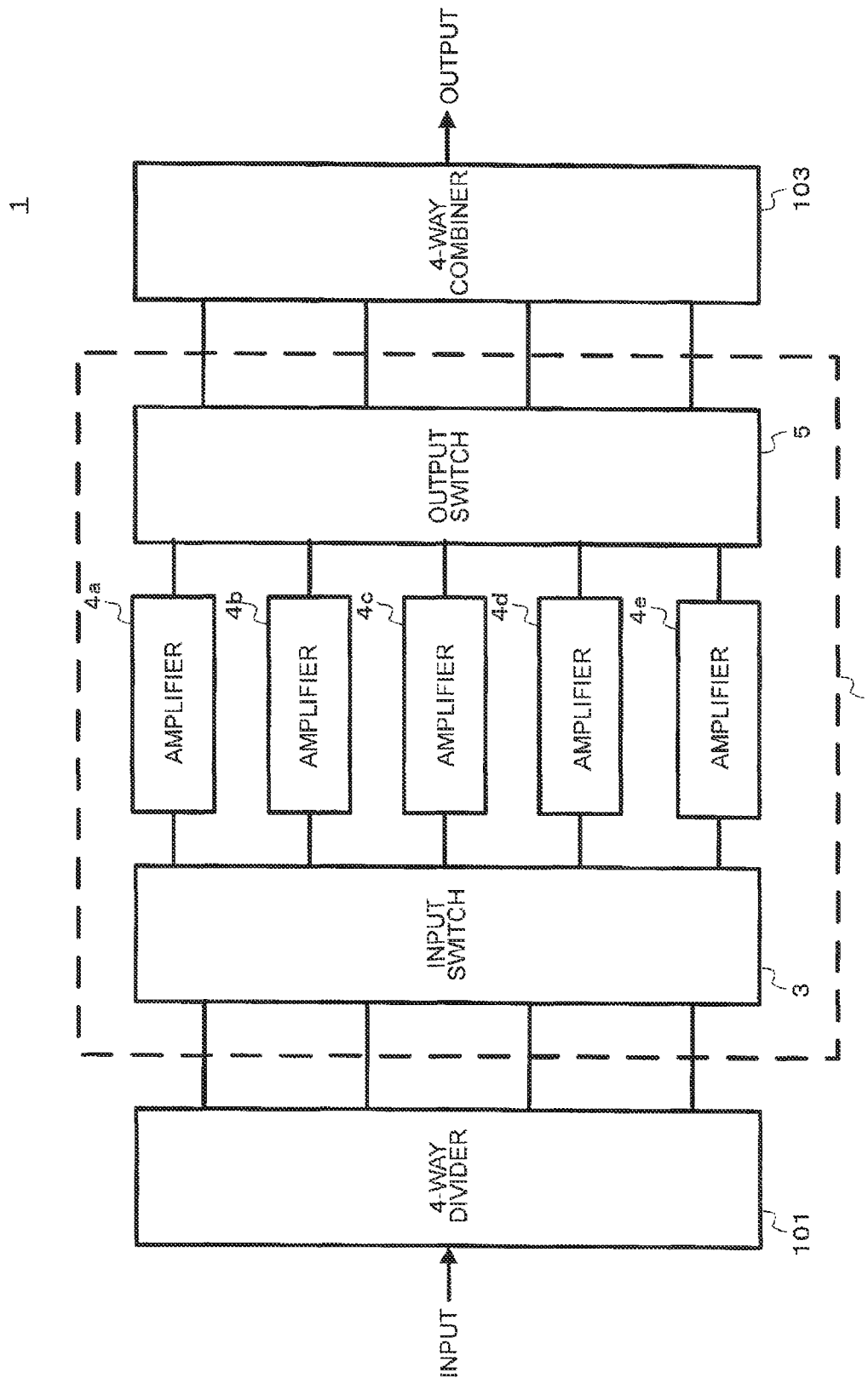
FIG. 2 is a block diagram of a signal amplifier 1 according to an embodiment of this invention.

In contrast, as illustrated in FIG. 2, a signal amplifier 1 according to a first embodiment of this invention includes a redundant amplifier 2 instead of the amplifier 102. The redundant amplifier 2 includes an input switch 3, five amplifiers 4a, 4b, 4c, 4d, and 4e, and an output switch 5. The five amplifiers 4a, 4b, 4c, 4d, and 4e each have the same signal path from an input to an output thereof. Similarly to the amplifier 102, the redundant amplifier 2 is an MPA that amplifies four signals, but differs from the amplifier 102 in that the redundant amplifier 2 has a redundant configuration including five amplifiers obtained by adding one stand-by amplifier to four active amplifiers. In order to prevent damage on functions and performances even when one amplifier fails, one redundant amplifier is mounted so that arbitrary four amplifiers are selected for use from five amplifiers in total. This redundant configuration is called 4/5 redundancy because four amplifiers are selected from five amplifiers.

As described later, when any of the active amplifiers fails, connection states in the input switch 3 and the output switch 5 are changed to remove the failed active amplifier from the signal path and add the stand-by amplifier to the signal path. At this time, however, the connection states are changed not simply so as to substitute the stand-by amplifier for the failed active amplifier. Signal paths passing through non-failed active amplifiers are also simultaneously changed.

The input switch 3 includes seven waveguide switches, which are each a double pole double throw (DPDT) switch called a C-switch. Similarly, the output switch 5 also includes seven waveguide switches, which are each a DPDT switch called a C-switch. That is, switches for achieving 4/5 redundancy are made up of seven waveguide switches on the input side and seven waveguide switches on the output side, that is, fourteen waveguide switches in total.

Figure 3:
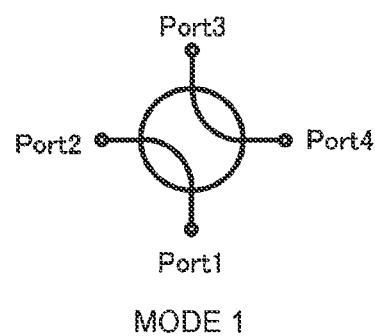
FIG. 3 is a mode diagram illustrating an operation of each of C-switches constituting an input switch 3 and an output switch 5 of the signal amplifier 1.
Figure 3:
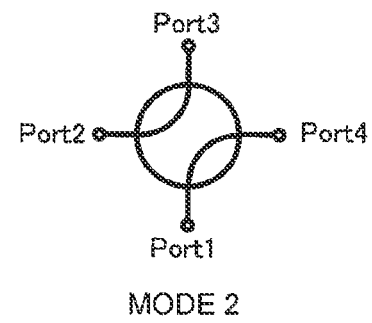

Operation modes of the C-switch are described with reference to FIG. 3. The C-switch includes four ports port 1, port 2, port 3, and port 4 and two waveguides for connecting two ports to each other. The C-switch has two modes, that is, Mode 1 and Mode 2, which differ in combination of ports connected by the waveguides. The two waveguides each have the same length. The C-switches constituting the input switch 3 and the output switch 5 each have the same specification, and hence a total of twenty-eight waveguides included in the fourteen waveguide switches each have the same length. In Mode 1, one waveguide connects port 1 and port 2 to each other, and the other waveguide connects port 3 and port 4 to each other. In Mode 2, one waveguide connects port 1 and port 4 to each other, and the other waveguide connects port 2 and port 3 to each other.

Figure 4:
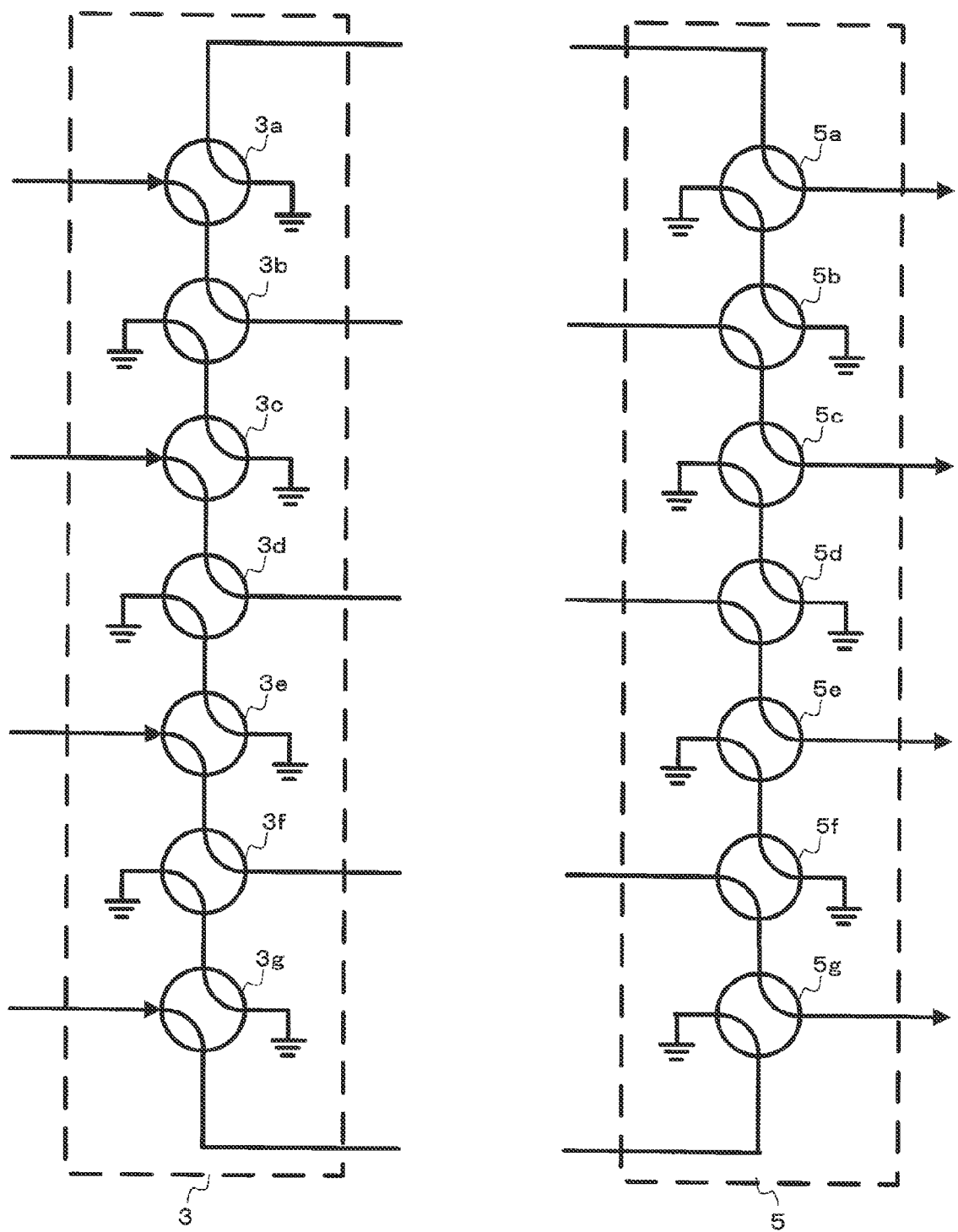
FIG. 4 is a diagram illustrating connection of the C-switches in the input switch 3 and the output switch 5.

As illustrated in FIG. 4, the input switch 3 has a structure in which port 1 and port 3 of seven C-switches 3a to 3g adjacent to each other are connected to each other so that the C-switches 3a to 3g are linearly connected to each other. In this case, the signal paths between the C-switches 3a and 3b, between the C-switches 3b and 3c, between the C-switches 3c and 3d, between the C-switches 3d and 3e, between the C-switches 3e and 3f, and between the C-switches 3f and 3g are each set to have the same length. Port 3 of the C-switch 3a at the upper end portion of FIG. 4 and port 1 of the C-switch 3g at the lower end portion thereof are connected to inputs of the amplifiers 4a and 4e, respectively. Port 4 of the C-switches 3b, 3d, and 3f are connected to inputs of the amplifiers 4b, 4c, and 4d, respectively. In this case, the Three signal paths between the C-switch 3b and the amplifier 4b, between the C-switch 3d and the amplifier 4c, and between the C-switch 3f and the amplifier 4d each have the same path length. Port 2 of the C-switches 3a, 3c, 3e, and 3g are each connected to one output of the divider 101. In this case, the signal paths between the C-switches 3a, 3c, 3e, and 3g and the outputs of the divider 101, respectively, each have the same path length. Port 4 of the C-switches 3a, 3c, 3e, and 3g and port 2 of the C-switches 3b, 3d, and 3f are grounded. The input switch 3 includes two C-switches 3c and 3e that are connected to any of the outputs of the divider 101 but not connected to the amplifier three C-switches 3b, 3d, and 3f that are not connected to the output of the divider 101 but connected to any of the inputs of the amplifiers, and two C-switches 3a and 3g that are connected to both of the divider 101 and the amplifiers.

As illustrated in FIG. 4, similarly, the output switch 5 has a structure in which port 1 and port 3 of seven C-switches 5a to 5g adjacent to each other are connected to each other so that the C-switches 5a to 5g are linearly connected to each other, in this case, the signal paths between the C-switches 5a and 5b, between the C-switches 5b and 5c, between the C-switches 5c and 5d, between the C-switches 5d and 5e, between the C-switches 5e and 5f, and between the C-switches 5f and 5g are each set to have the same length. Port 3 of the C-switch 5a at the upper end portion of FIG. 4 and port 1 of the C-switch 5g at the lower end portion thereof are connected to outputs of the amplifiers 4a and 4e, respectively. Port 4 of the C-switches 5b, 5d, and 5f are connected to outputs of the amplifiers 4b, 4c, and 4d, respectively. In this case, the three signal paths between the C-switch 5b and the amplifier 4b, between the C-switch 5d and the amplifier 4c, and between the C-switch 5f and the amplifier 4d each have the same path length. Port 4 of the C-switches 5a, 5c, 5e, and 5g are each connected to inputs of the combiner 103, respectively. In this case, the signal paths between the C-switches 5a, 5c, 5e, and 5g and the inputs of the combiner 103, respectively, each have the same path length. Port 2 of the C-switches 5a, 5c, 5e, and 5g and port 4 of the C-switches 5b, 5d, and 5f are grounded. The output switch 5 includes two C-switches 5c and 5e that are connected to any of the inputs of the combiner 103 but not connected to the amplifier, three C-switches 5b, 5d, and 5f that are not connected to the input of the combiner 103 but connected to any of the inputs of the amplifiers, and two C-switches 5a and 5g that are connected to both of the combiner 103 and the amplifiers. Note that, in FIG. 4, in all of the C-switches of the input switch 3 and the output switch 5, similarly to FIG. 3, port 1, port 2, port 3, and port 4 are arranged in the 6 o'clock direction, the 9 o'clock direction, the 12 o'clock direction, and the 3 o'clock direction in the figure, respectively.

Signal paths from an output of the divider 101 via any of the amplifiers 4b, 4c, and 4d to an input of the combiner 103 are considered. The following may be understood. No matter which amplifier is used, by appropriately determining the connection states of the input switch 3 and the output switch 5 as the signal paths, signal paths passing through two C-switches of the input switch 3 and two C-switches of the output switch 5 can be determined.

The signal paths include the following paths of (1) to (11): (1) a path from an output of the divider 101 to port 2 of a C-switch 3w (where w represents any one of a, c, e, and g) of the input switch 3; (2) a waveguide connecting port 2 to port 1 or port 3 of the C-switch 3w; (3) path from the C-switch 3w to an adjacent C-switch 3x (where x represents any one of 3b, 3d, and 3f); (4) a waveguide connecting port 1 or port 3 to port 4 of the C-switch 3x; (5) a path from the C-switch 3x to an input of an amplifier; (6) a path inside the amplifier; (7) a path from the amplifier to port 2, of a C-switch 5y (where y represents any one of b, d, and e) of the output switch 5; (8) a waveguide connecting port 2 to port 1 or port 3 of the C-switch 5y; (9) a path from the C-switch 5y to an adjacent C-switch 5z (where z represents any one of a, c, e, and g); (10) a waveguide connecting port 1 or port 3 to port 4 of the C-switch 5z; and (11) a path from the C-switch 5z to an input of the combiner 103. The respective paths of (1)~(11) each have the constant length in any combination of the two C-switches of the input switch 3, the amplifier, and the two C-switches of the output switch 5 to be passed.

On the other hand, a signal path from an output of the divider 101 via any one of the amplifiers 4a and 4e to an input of the combiner 103 is considered, which is one of a path passing through the C-switch 3a, the amplifier 4a, and the C-switch 5a or a path passing through the C-switch 3g, the amplifier 4e, and the C-switch 5g. As compared to the above-mentioned paths passing through any of the amplifiers 4b, 4c, and 4d, the path passes only one C-switch inside each of the input switch 3 and the output switch 5. Therefore, the number of C-switches through which the entire path passes is reduced by two, and the path is shortened by a length corresponding to two waveguides. Further, there is no path connecting the C-switches to each other, and hence the path is shortened by this length. The reduced length is compensated for by a path from port 4 of the C-switch 3a to the amplifier 4a and a path from the amplifier 4a to port 2 of the C-switch 5a. in this manner, the length of the path passing through the amplifier 4a can be set equal to that of the above-mentioned path passing through any of the amplifiers 4b, 4c, and 4d. The same applies to the length of the path passing through the amplifier 4e.

Figure 5:
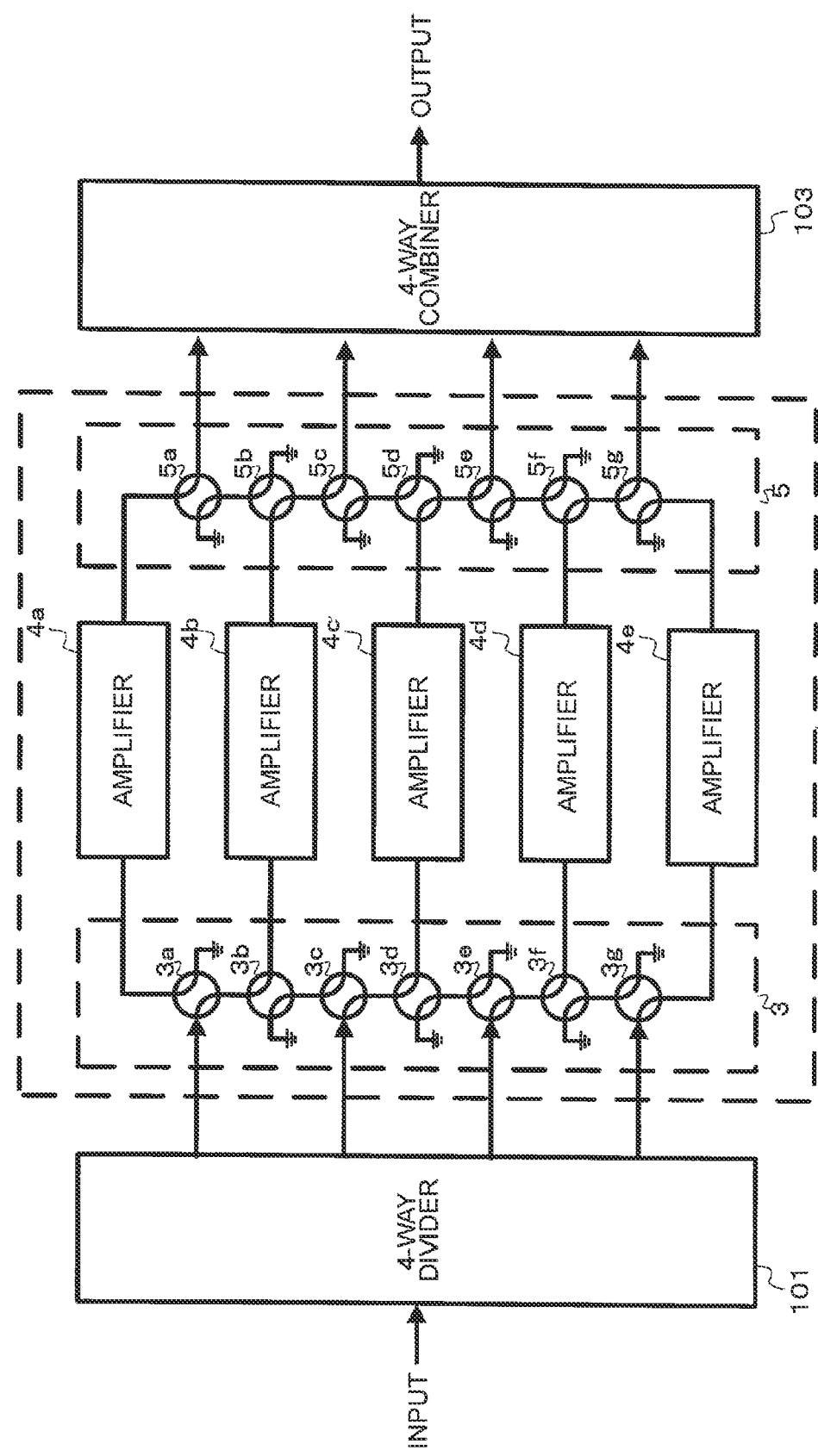
FIG. 5 is a block diagram illustrating the entire connection relationship including connection relationships among individual C-switches and individual amplifiers in the signal amplifier 1.

FIG. 5 illustrates the entire connection relationship including the connection relationships among the individual C-switches and the individual amplifiers in the signal amplifier 1. In the signal amplifier 1, C-switches, that is, waveguide switch groups are inserted in the upstream and the downstream of the amplifiers having the redundant configuration, thereby enabling obtaining the 4/5 redundant configuration of the amplifiers. According to connection states in the input switch 3 and the output switch 5 depicted in FIG. 5, three amplifiers 4b-4d are active but the 4/5 redundant configuration is not established so far. The connection states to establish the 4/5 redundant configuration will be described later with reference to FIGS. 6 to 10.

The redundant amplifier 2 is a 4-port MPA. From the input side of the redundant amplifier 2, four signals obtained by dividing a signal input to the divider 101 into four are input to four of the five amplifiers 4a to 4e via the input switch 3. On the other hand, on the output side of the redundant amplifier 2, outputs of the four of the five amplifiers 4a to 4e to which the signals have been input are output as four signals to the combiner 103 via the output switch 5, and the combiner 103 combines the four signals to output the combined one signal.

As described above, in the signal amplifier 1, the connection states in the input switch 3 and the output switch 5 are appropriately determined so that the signal path from the divider 101 via any of the amplifiers to the combiner 103 can be connected in a manner that the paths passing the respective amplifiers each have the same path length. In other words, a redundant amplifier can be selected without changing the signal amplitude and phase.

Note that, the upstream (input side) of the input switch 3 and the downstream (output side) of the output switch 5 are completely the same as those in a conventional 4-port MPA.

Next, with reference to FIGS. 6 to 10, switching of the connection states in the input switch 3 and the output switch 5 of the signal amplifier 1 is described. The amplifier 4c is assumed as the stand-by amplifier, and the remaining amplifiers 1a, 4b, 4d, and 4e are assumed as the active amplifiers.

Figure 6:
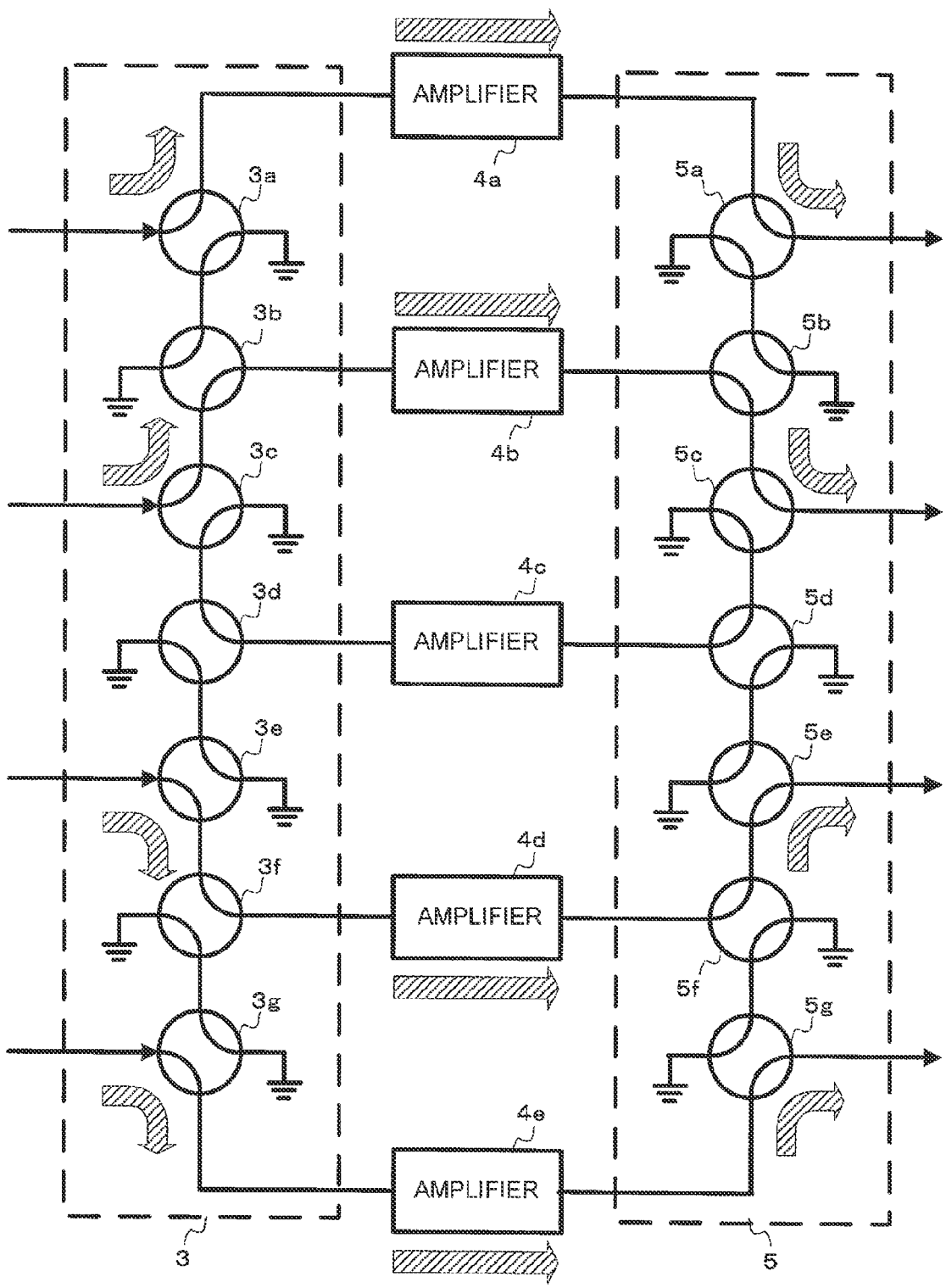
FIG. 6 is a diagram illustrating connection states of the input switch 3 and the output switch 5 when four paths passing through active amplifiers 4a, 4b, 4d, and 4e are established in the redundant amplifier 2.

First, it is assumed that all of the active amplifiers are normally operated, and the stand-by amplifier is in a standby state. FIG. 6 illustrates the connection states at this time. At this time, the following four signal paths R1 to R4 are established between the output of the divider 101 and the input of the combiner 103.

In the input switch 3, the C-switches 3a to 3c are in Mode 2, and the C-switches 3d to 3g are in Mode 1. In the output switch 5, the C-switches 5a to 5c are in Mode 1, and the C-switches 5d to 5g are in Mode 2. As a result, as the path R1, a path passing through the C-switch 3a, the amplifier 4a, and the C-switch 5a is established. As the path R2, a path passing through the C-switch 3c, the C-switch 3b, the amplifier 4b, the C-switch 5b, and the C-switch 5c is established. As the path R3, a path passing through the C-switch 3e, the C-switch 3f, the amplifier 4d, the C-switch 5f, and the C-switch 5e is established. As the path R4, a path passing through the C-switch 3g, the amplifier 4e, and the C-switch 5g is established.

The paths R1 and R4 are each a path passing through one amplifier and one C-switch in each of the input switch 3 and the output switch 5. The paths R2 and R3 are each a path passing through one amplifier and two C-switches in each of the input switch 3 and the output switch 5. As described above, the paths R1 to R4 each have the same path length.

The amplifier 4c is a stand-by amplifier, and hence, in this case, a path between the divider 101 and the combiner 103 via the amplifier 4c is not established. The input and the output of the standby redundant amplifier 4c are terminated via the input switch 3 and the output switch 5. The input of the amplifier 4c is grounded via the C-switch 31 and the C-switch 3c. Similarly, the output of the amplifier 4d is grounded via the C-switch 5d and the C-switch 5c.

Next, it is assumed that one of the active amplifiers is disabled for some reasons. At this time, the standby redundant amplifier 4c is activated, and the connection states of the input switch 3 and the output switch 5 are changed. In this manner, the configuration of the four amplifiers connecting together the divider 101 and the combiner 103 is changed.

When a problem occurs in an amplifier in a certain path, the connection states of the input switch 3 and the output switch 5 are changed so that the path passes through an amplifier arranged adjacent on the stand-by amplifier 4c side when viewed from the failed amplifier. When the amplifier in the changed path is not the stand-by amplifier 4c but an active amplifier, and a different path actually passes through the amplifier, similarly to the above-mentioned path, the connection states of the input switch 3 and the output switch 5 are changed so that the path passes through an amplifier arranged adjacent on the stand-by amplifier 4c side when viewed from the amplifier through which the path actually passes. When this operation is sequentially repeated thereafter until a path passing through the stand-by amplifier 4c is established, finally, four paths passing through four amplifiers in total other than the failed active amplifier, that is, three active amplifiers and a stand-by amplifier, are established.

Note that, in the signal amplifier 1, the standby redundant amplifier is activated in accordance with occurrence of a problem in the active amplifier, and the input switch and the output switch are switched in cooperation to each other to change the signal path. In order to automatically perform this operation, it is preferred that the signal amplifier 1 further include a processing device (not shown) for monitoring and controlling the operation states of the amplifiers 4a to 4e and controlling the connection states of the input switch 3 and the output switch 5. When this processing device detects occurrence of a problem in any of the active amplifiers, the processing device stops the amplifier and activates the stand-by amplifier. Further, the C-switches 3a to 3g and 5a to 5g are switched in accordance with the amplifier having a problem, to thereby change the connection state between the divider 101 and the combiner 103.

Figure 7:
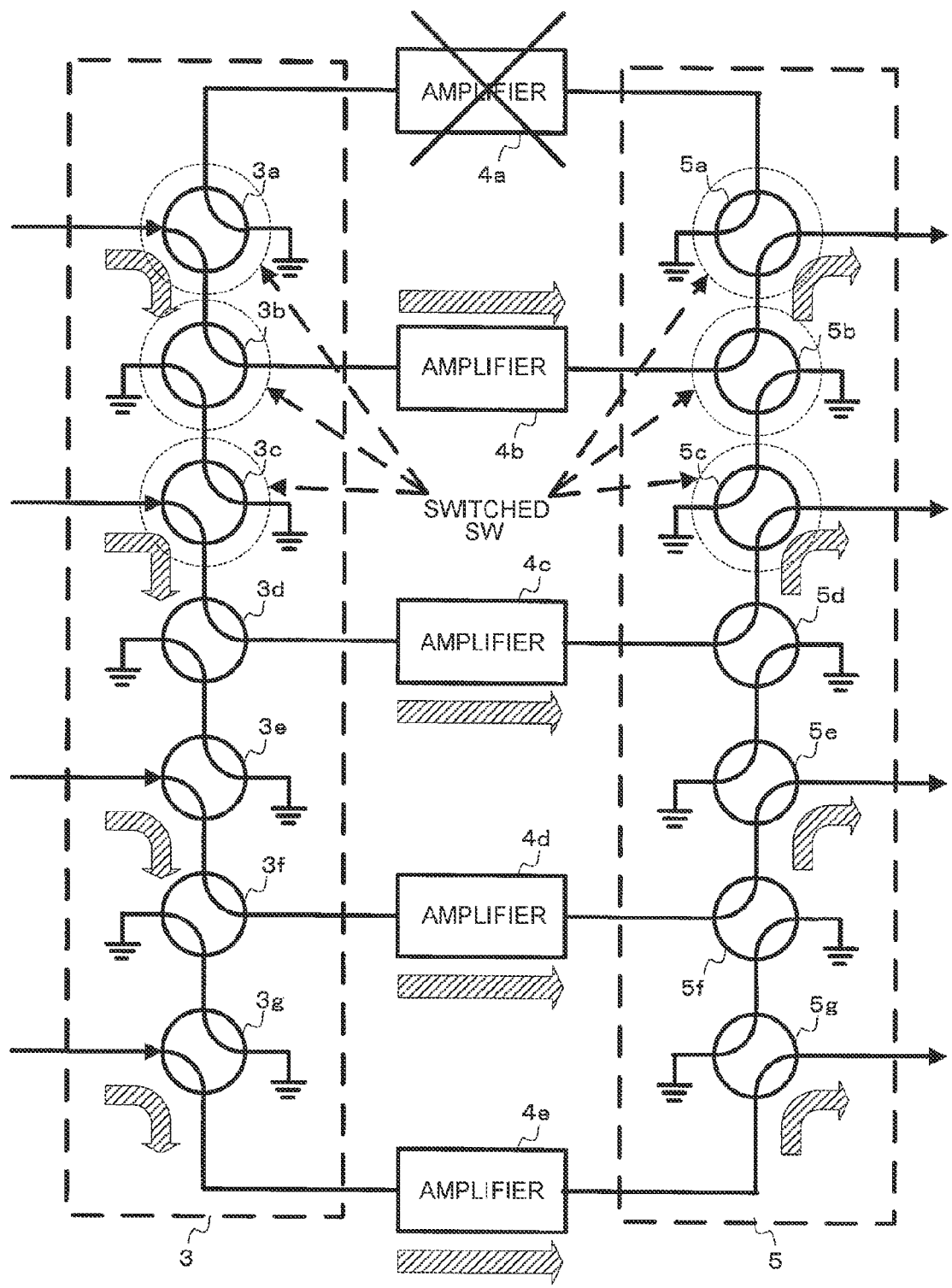
FIG. 7 is a diagram illustrating connection states of the input switch 3 and the output switch 5 when a problem has occurred in the active amplifier 4a and four paths passing through the active amplifiers 4b, 4d, and 4e and a stand-by amplifier 4c are established in the redundant amplifier 2.

An operation performed when the signal amplifier 1 is in the connection state of FIG. 6 and a problem occurs in the amplifier 4a is described. At this time, the amplifier 4c as the stand-by amplifier is activated, the C-switches 3a and 3b are each switched from Mode 2 to Mode 1, and the C-switches 5a and 5b are each switched from Mode 1 to Mode 2. In this manner, the amplifier through which the path R1 passes is changed from the amplifier 4a to the amplifier 4b. Further, the C-switch 3c is switched from Mode 2 to Mode 1, and the C-switch 5c is switched from Mode 1 to Mode 2. In this manner, the amplifier through which the path R2 passes is changed from the amplifier 4b to the amplifier 4c. FIG. 7 illustrates a connection state after the change.

With this switching, the path R1 is changed from a path passing through one amplifier and one C-switch in each of the input switch 3 and the output switch 5 to a path passing through one amplifier and two C-switches in each of the input switch 3 and the output switch 5, but the fact that the paths R1 to R4 each have the same path length does not change.

Figure 8:
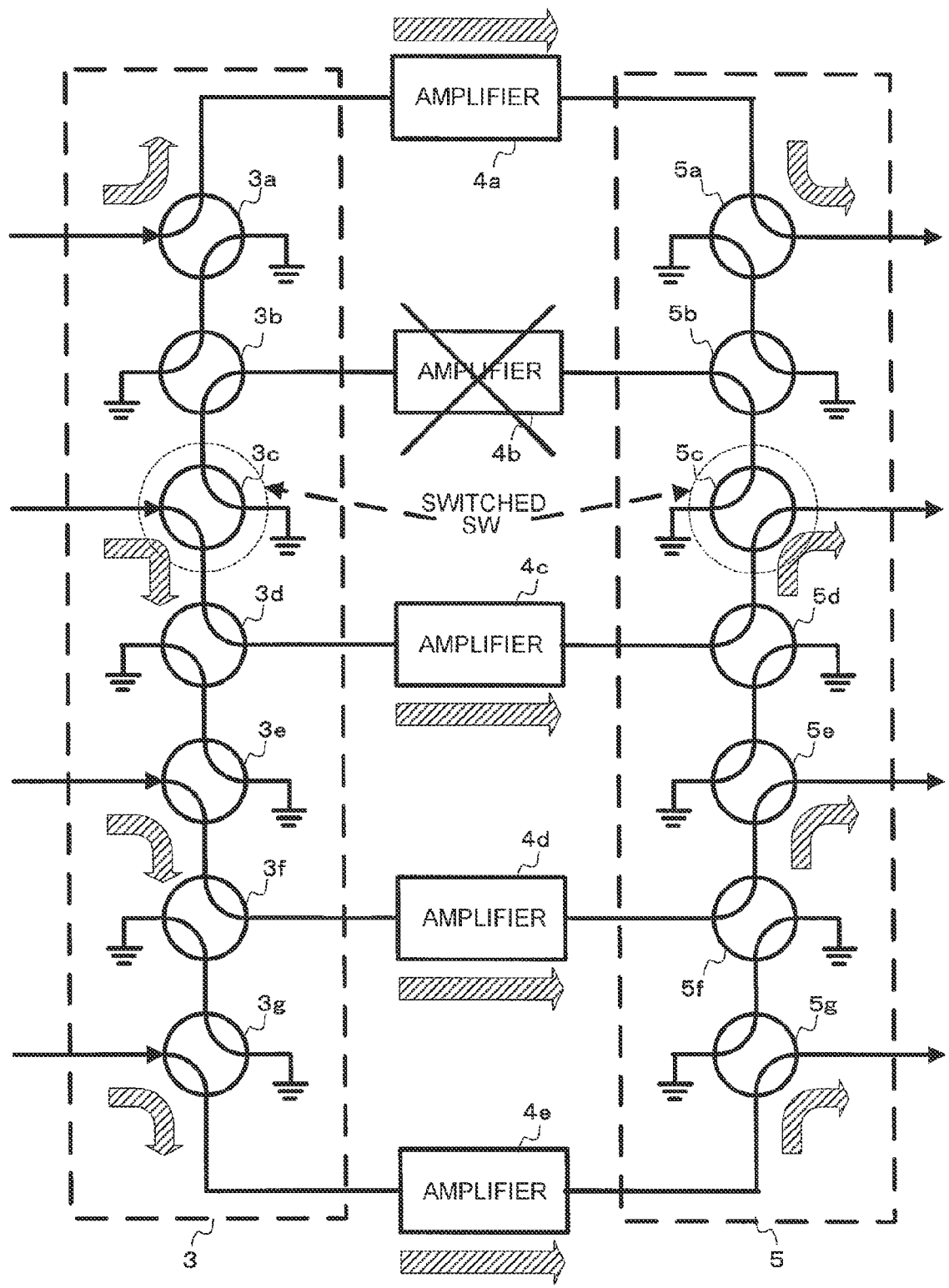
FIG. 8 is a diagram illustrating connection states of the input switch 3 and the output switch 5 when a problem has occurred in the active amplifier 4b and four paths passing through the active amplifiers 4a, 4d, and 4e and the stand-by amplifier 4c are established in the redundant amplifier 2.

An operation performed when the signal amplifier 1 is in the connection state of FIG. 6 and a problem occurs in the amplifier 4b is described. At this time, the amplifier 4c as the stand-by amplifier is activated, the C-switch 3c is switched from Mode 2 to Mode 1, and the C-switch 5c is switched from Mode 1 to Mode 2. In this manner, the amplifier through which the path R2 passes is changed from the amplifier 4b to the amplifier 4c. FIG. 8 illustrates a connection state after the change.

With this switching, the path R2 passes through the C-switch 3d, the amplifier 4c, and the C-switch 5d instead of passing through the C-switch 3b, the amplifier 4b, and the C-switch 5b, but the fact that the path R2 is a path passing through one amplifier and two C-switches in each of the input switch 3 and the output switch 5 does not change, and also the fact that the paths R1 to R4 each have the same path length does not change.

Figure 9:
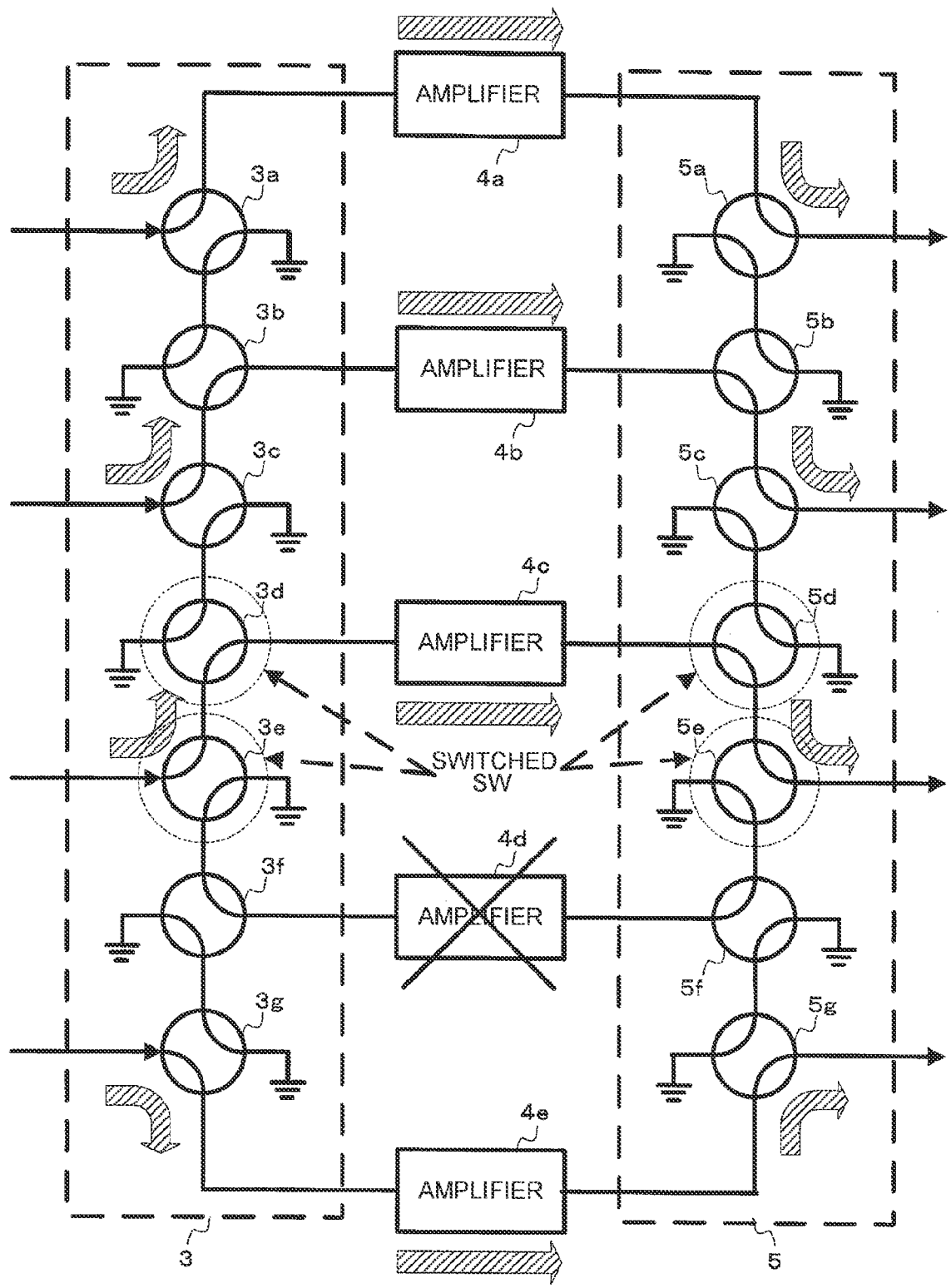
FIG. 9 is a diagram illustrating connection states of the input switch 3 and the output switch 5 when a problem has occurred in the active amplifier 4d and four paths passing through the active amplifiers 4a, 4b, and 4e and the stand-by amplifier 4c are established in the redundant amplifier 2.

An operation performed when the signal amplifier 1 is in the connection state of FIG. 6 and a problem occurs in the amplifier 4d is described. The amplifier 4c as the stand-by amplifier is activated, the C-switches 3d and 3e are each switched from Mode 1 to Mode 2, and the C-switches 5d and 5e are each switched from Mode 2 to Mode 1. In this manner, the amplifier through which the path R3 passes is changed from the amplifier 4d to the amplifier 4c. FIG. 9 illustrates a connection state after the change.

Figure 10:
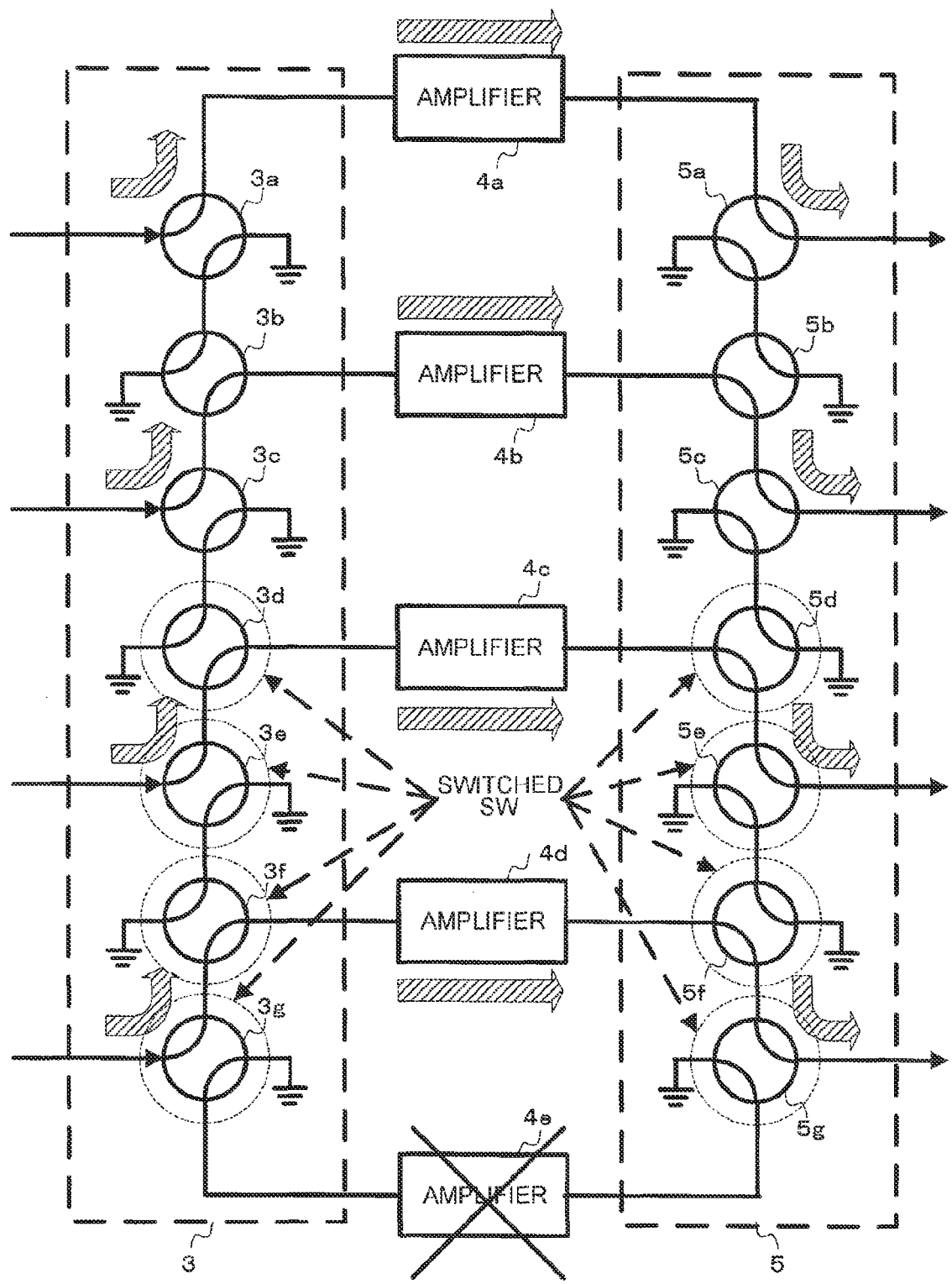
FIG. 10 is a diagram illustrating connection states of the input switch 3 and the output switch 5 when a problem has occurred in the active amplifier 4e and four paths passing through the active amplifiers 4a, 4d, and 4d and the stand-by amplifier 4c are established in the redundant amplifier 2.

An operation performed when the signal amplifier 1 is in the connection state of FIG. 6 and a problem occurs in the amplifier 4e is described. The amplifier 4c as the stand-by amplifier activated, the C-switches 3d and 3g are each switched from Mode 1 to Mode 2, and the C-switches 5d and 5g are each switched from Mode 2 to Mode 1. In this manner, the amplifier through which the path R3 passes is changed from the amplifier 4d to the amplifier 4c, and the amplifier through which the path R4 passes is changed from the amplifier 4e to the amplifier 4d. FIG. 10 illustrates a connection state after the change.

As described above, even when a problem occurs in arbitrary one of the four active amplifiers, by changing the connection states of the input switch 3 and the output switch 5, a function of amplifying the four input signals can be maintained by using four amplifiers in total excluding the active amplifier having a problem, that is, three active amplifiers and a stand-by amplifier. Although the C-switch and the amplifier through which each path passes change by changing the connection states, the path length does not change and the four paths each have the same path length. Therefore, the signals output from the respective paths may each have the same the amplitude and phase.

The above-mentioned switching operation is described assuming that the amplifier 4c is the stand-by amplifier, but a different amplifier may be the stand-by amplifier. It may be easily understood that, no matter which amplifier is the stand-by amplifier, by appropriately changing the connection states of the input switch 3 and the output switch 5, such a path that the path length does not change before and after the change of the connection states can be established.

The number of amplifiers to be mounted on the MPA is a power of 2 in principle. The number of the amplifiers to be mounted is 2, 4, 8, 16, . . . . The redundant amplifier 2 has a configuration in which one stand-by amplifier is added as a standby redundancy to the MPA having four amplifiers mounted thereon. However, it is also possible to configure the redundant amplifier in which the path length does not change even after redundant switching by adding one stand-by amplifier similarly to the redundant amplifier 2 even in the case of an MPA in which the number of the amplifiers to be mounted thereon is 2, 4, 8, 16, . . . . The number of C-switches necessary for the MPA having such a redundant configuration is obtained as follows.

A redundant amplifier including n amplifiers (n is a natural number) including one stand-by amplifier and having a configuration and effect similar to those of the redundant amplifier 2 includes three types of C-switches. First, considering the input switch, the three types of C-switches include two first C-switches (C-switches 3a and 3g) located at both ends of the amplifiers arrayed in parallel and directly connected to both of the amplifier and the divider, (n−2) second C-switches (C-switches 3b, 3d, and 3f) directly connected to the amplifiers other than the amplifiers at both the ends, and (n−3) third C-switches (C-switches 3c and 3e) which are fewer than the second switches by one, arranged between two second switches, and directly connected to the divider. The same applies also to the output switch. The number of C-switches necessary for the signal amplifier of this embodiment, which includes n amplifiers, is (2+n−2+n−3)×2=4n−6.

As described above, even when n amplifiers are provided, if a problem occurs in an amplifier of a certain path, the connection states of the input switch and the output switch are changed so that the path passes through an amplifier arranged adjacent on the stand-by amplifier side when viewed from the failed amplifier. When the amplifier in the changed path is not the stand-by amplifier, and a different path actually passes through the amplifier, similarly to the above, the connection states of the input switch and the output switch are changed so that the path also passes through an amplifier on the stand-by amplifier side. This operation is sequentially repeated thereafter until the path passes through the stand-by amplifier. With this, even in the redundant amplifier including n amplifiers, effects similar to those of the above-mentioned redundant amplifier 2 can be obtained.

Figure 11:
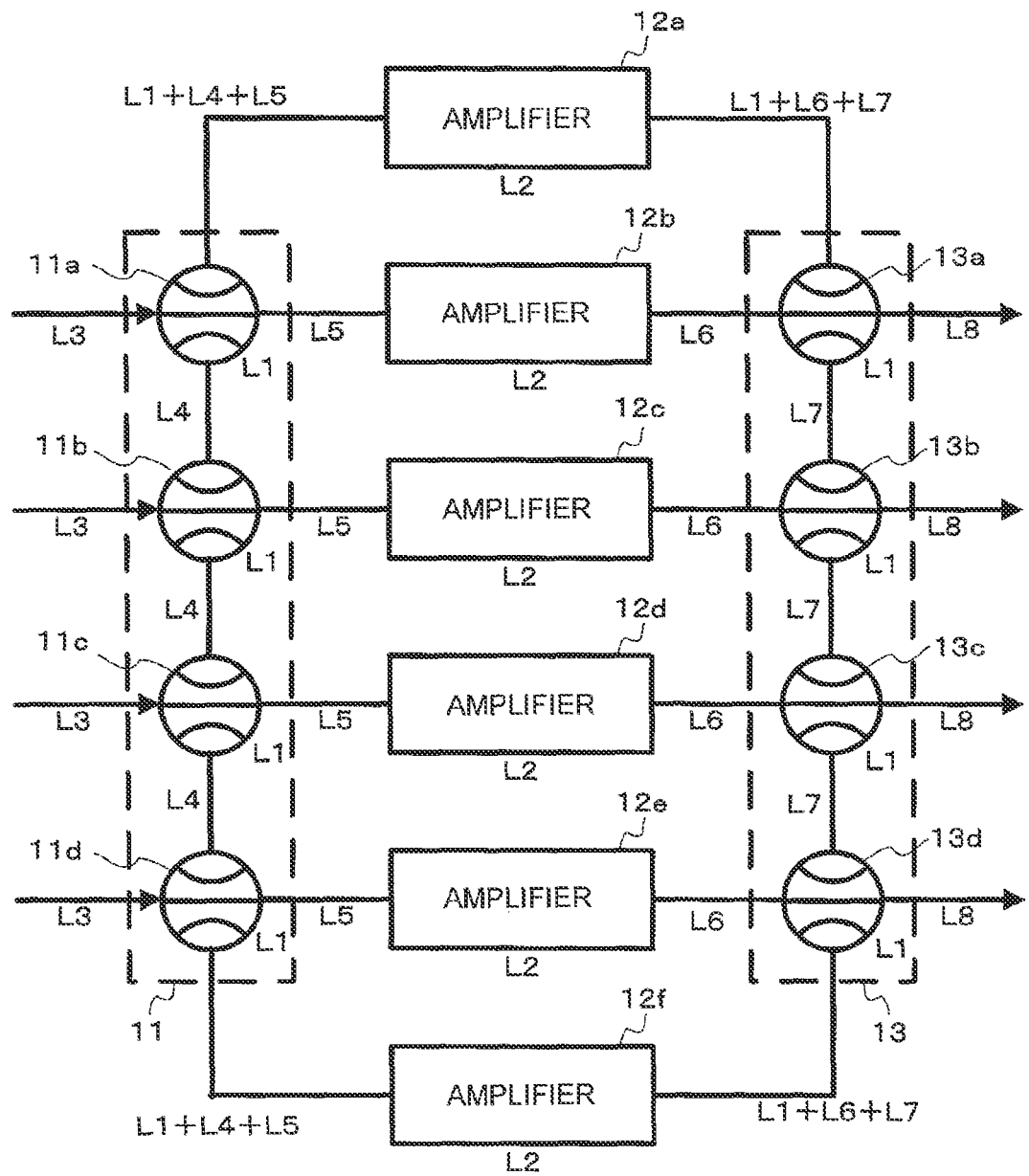
FIG. 11 is a block diagram illustrating a configuration of a redundant amplifier 10, and illustrating connection states of an input switch 11 and an output switch 13 when four paths passing through active amplifiers 12b, 12c, 12d, and 12e are established.

A redundant amplifier 10 according to a second embodiment of this invention is described with reference to FIG. 11. The redundant amplifier 10 functions as an MPA for amplifying four signals similarly to the above-mentioned redundant amplifier 2. While the redundant amplifier 2 includes one stand-by amplifier so as to deal with a problem of one active amplifier, the redundant amplifier 10 includes two stand-by amplifiers so as to deal with problems of up to two active amplifiers. In FIGS. 2 and 5, the redundant amplifier 10 is connectable to the divider 101 and the combiner 103 in place of the redundant amplifier 2.

The redundant amplifier 10 includes an input switch 11, six amplifiers 12a to 12f, and an output switch 13. The inside path lengths from inputs to outputs of the respective amplifiers 12a to 12f are all equal to each other.

The input switch 11 is a switch matrix including four waveguide switches. The waveguide switch of the redundant amplifier 2 is a C-switch, but waveguide switches 12a to 12f of the input switch 11 are each an R-switch having four modes.

Figure 12:
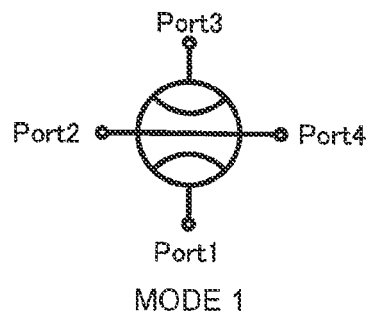
FIG. 12 is a diagram illustrating Mode 1, Mode 2, Mode 3, and Mode 4 that are connection states of each of waveguide switches (R-switches) 11a to 11d and 13a to 13d constituting the input switch 11 and the output switch 13.
Figure 12:
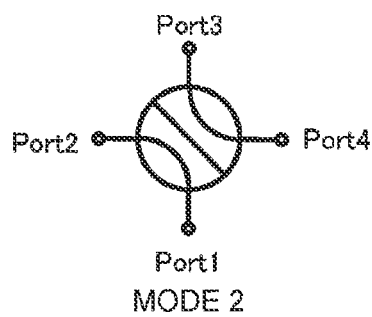
Figure 12:
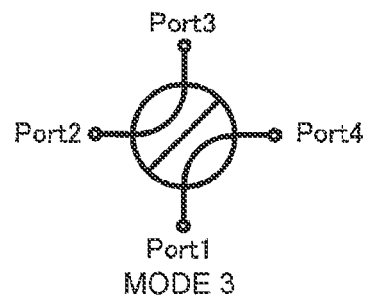
Figure 12:
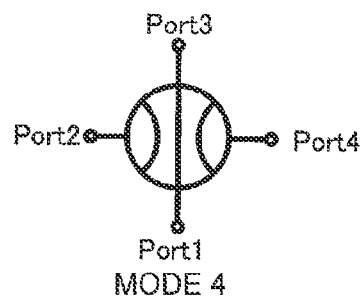

With reference to FIG. 12, the waveguide switches 12a to 12f are further described. The waveguide switches 12a to 12f (also referred to as R-switches 12a to 12f) each include four ports port 1, port 2, port 3, and port 4, and three waveguides for connecting together two ports that are adjacent or opposed to each other. Port 1 to port 4 are sequentially arranged in the 6 o'clock direction, the 9 o'clock direction, the 12 o'clock direction, and the 3 o'clock direction. In Mode 1, connection is established merely between port 1 and port 3. In Mode 2, connection is established between port 1 and port 2, and between port 3 and port 4. In Mode 3, connection is established between port 1 and port 4, and between port 2 and port 3. In Mode 4, connection is established merely between port 2 and port 4.

The three waveguides of each of the R-switches 11a to 11d and 13a to 13d each have same length. This path length is represented by L1. As described above, the inside paths of the respective amplifiers 12a to 12f each have the same length. This path length is represented by L2. The paths from the outputs of the divider 101 to port 2 of the respective R-switches 11a to 11d each have the same length. This path length is represented by L3. In the input switch 11, the paths connecting between the adjacent R-switches, that is, the paths between the R-switches 11a and 11b, between 11b and 11c, and between 11c and 11d all each the same length. This path length is represented by L4. The paths between port 4 of the R-switches 11a to 11d and the respective inputs of the amplifiers 12b to 12c each have the same length. This path length is represented by L5. The path between the port 3 of the R-switch 11a and the input of the amplifier 12a, and the path between port 1 of the R-switch 11d and the input of the amplifier 12f each have a length of L1+L4+L5. The paths between the respective outputs of the amplifiers 12b to 12e and port 2 of the R-switches 13a to 13d each have the same length. This path length is represented by L6. In the output switch 13, the paths connecting between the adjacent R-switches, that is, the paths between the R-switches 13a and 13b, between 13b and 13c, and between 13c and 13d each have the same length. This path length is represented by L7. The path between the output of the amplifier 12a and port 3 of the R-switch 13a, and the path between the output of the amplifier 12f and port 1 of the R-switch 13d each have a length of L1+L6+L7. The paths from port 4 of the respective R-switches 13a to 13d to the inputs of the combiner 103 each have the same length. This path length is represented by L8.

An operation of the redundant amplifier 10 is described. Four amplifiers 12b to 12c are provided as the active amplifiers, and two amplifiers 12a and 12f are provided as the stand-by amplifiers. When all of the active amplifiers are normally operated, as illustrated in FIG. 11, all of the R-switches 11a to 11d and 13a to 13d are in Mode 1. In this embodiment, regardless of the amplifier through which the path passes in the middle, the path from the output of the divider 101 to the input of the combiner 103 is called as follows in accordance with the ports of the R-switches as an input and an output of the redundant amplifier 10. That is, the path having an input from port 2 of the R-switch 11a and an output from port 4 of the R-switch 13a is called a path R1, the path having an input from port 2 of the R-switch 11b and an output from port 4 of the R-switch 13b is called a path R2, the path having an input from port 2 of the R-switch 11c and an output from port 4 of the R-switch 13c is called a path R3, and the path having an input from port 2 of the R-switch 11d and an output from port 4 of the R-switch 13d is called a path R4.

Figure 13:
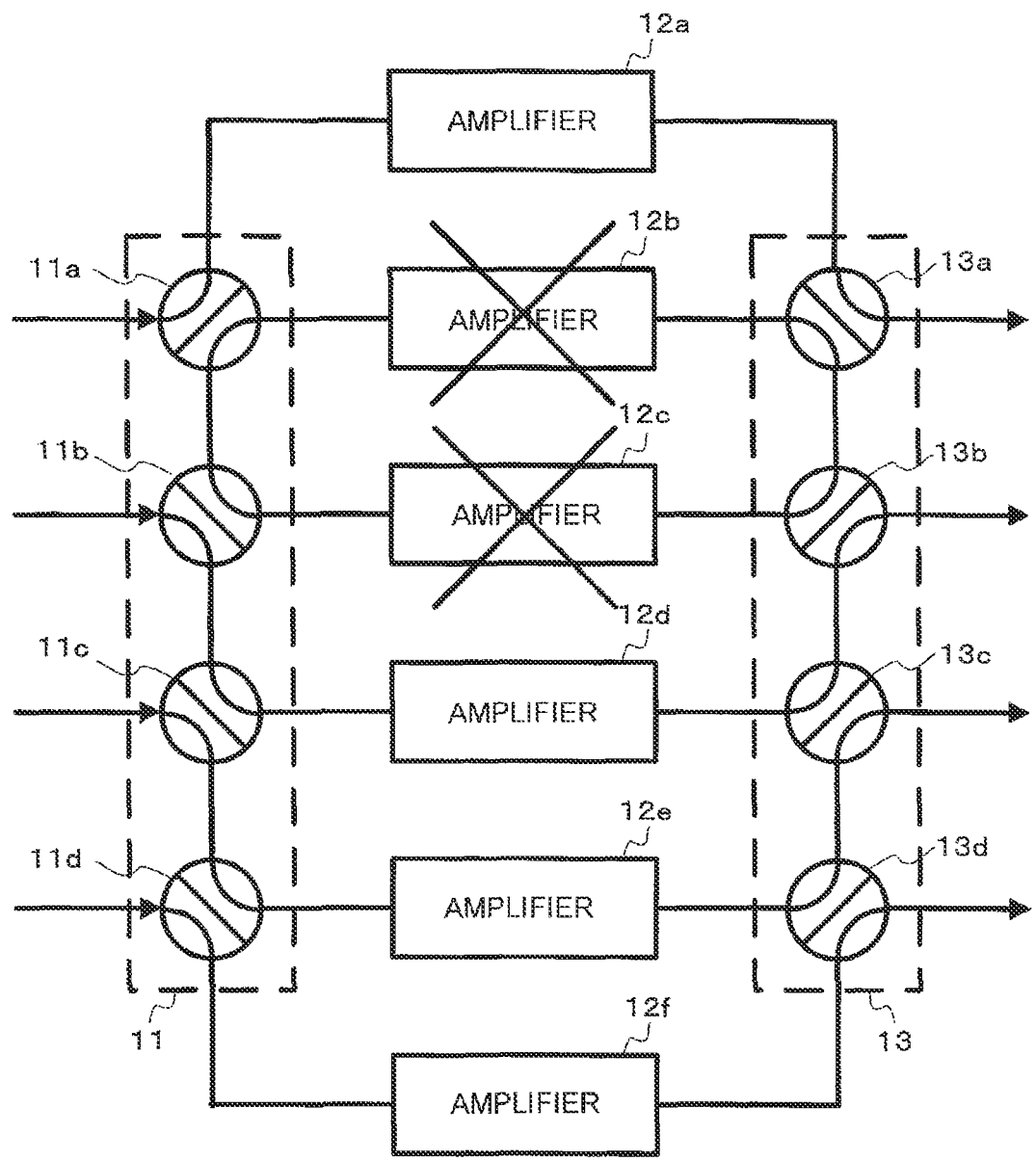
FIG. 13 is a diagram illustrating connection states of the input switch 11 and the output switch 13 when a problem has occurred in the active amplifiers 12b and 12c and four paths passing through the active amplifiers 12d and 12e and stand-by amplifiers 12a and 12f are established in the redundant amplifier 10.

Now, it is assumed that a problem has occurred in at least one of the amplifiers 12b and 12c. The problem may occur in one of the amplifiers 12b and 12c, or both of the amplifiers. At this time, as illustrated in FIG. 13, the R-switches 11a to 11d and 13a to 13d are switched. That is, in order to change the amplifier through Which the path R1 passes from the amplifier 12b to the amplifier 12a, the R-switch 11a is switched to Mode 3, and the R-switch 13a is switched to Mode 2. In order to change the amplifier through which the path R2 passes from the amplifier 12c to the amplifier 12d, the R-switches 11b and 11c are each switched to Mode 2, and the R-switches 13b and 13c are each switched to Mode 3. Further, in order to change the amplifier through which the path R3 passes from the amplifier 12d to the amplifier 12e, and change the amplifier through which the path R4 passes from the amplifier 12e to the amplifier 12f, the R-switch 11d is switched to Mode 2, and the R-switch 13d is switched to Mode 3. At this time, the amplifiers 12b and 12c are separated from the paths R1 to R4.

Figure 14:
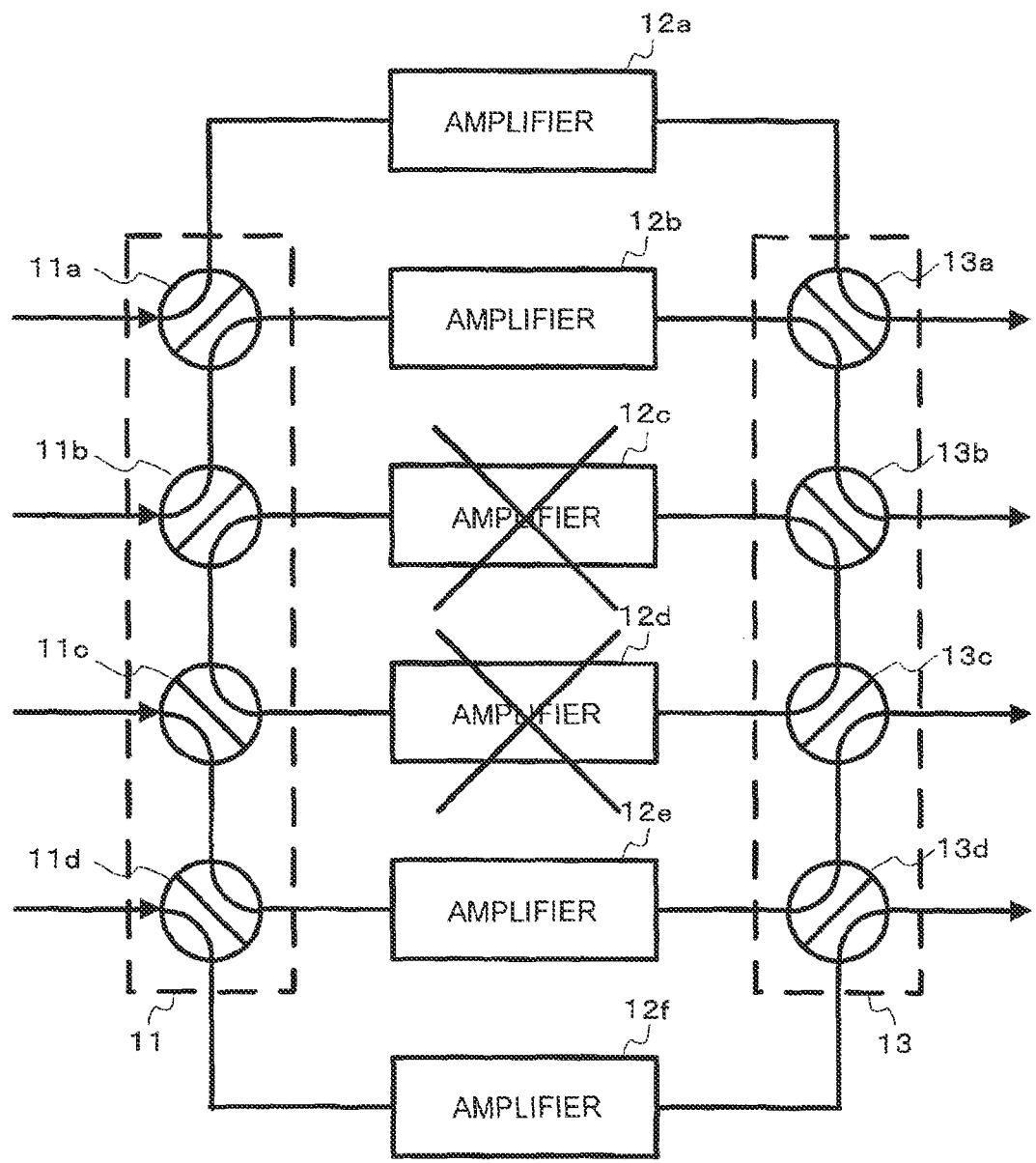
FIG. 14 is a diagram illustrating connection states of the input switch 11 and the output switch 13 when a problem has occurred in the active amplifiers 12c and 12d and four paths passing through the active amplifiers 12b and 12e and stand-by amplifiers 12a and 12f are established in the redundant amplifier 10.

Alternatively, now, it is assumed that a problem has occurred in at least one of the amplifiers 12c and 12d. Similarly to the above-mentioned case, the problem may occur in one of the amplifiers 12c and 12d, or both of the amplifiers. At this time, as illustrated in FIG. 14, the R-switches 11a to 11d and 13a to 13d are switched. That is, in order to change the amplifier through which the path R1 passes from the amplifier 12b to the amplifier 12a, the R-switch 11a is switched to Mode 3, and the R-switch 13a is switched to Mode 2. In order to change the amplifier through which the path R2 passes from the amplifier 12c to the amplifier 12b the R-switch 11b is switched to Mode 3, and the R-switch 13b is switched to Mode 2. In order to change the amplifier through which the path R3 passes from the amplifier 12d to the amplifier 12e, and change the amplifier through which the path R4 passes from the amplifier 12e to the amplifier 12f, the R-switch 11d is switched to Mode 2, and the R-switch 13d is switched to Mode 3. At this time, the amplifiers 12c and 12d are separated from the paths R1 to R4.

Description of an operation when a problem occurs in at least one of the amplifiers 12d and 12e is omitted because the redundant amplifier 10 is vertically symmetric, and hence the operation may be inferred based on FIG. 13 and description corresponding thereto.

The paths R1 to R4 before switching each have the length of L3+L1+L5+L2+L6+L1+L8=2L1+L2+L3+L5+L+L8. At this time, the paths R1 to R4 are each a linear path passing through two R-switches and one amplifier. Thus, it may be promptly understood visually from FIG. 11 that each of the paths has the same length.

On the other hand, the paths R1 to R4 after the switching are each a bypass path that passes through not an amplifier connected on the straight line between the corresponding R-switches of the input switch 11 and the output switch 13, but an amplifier arranged adjacent to the amplifier, and include two types of paths of a path passing through two R-switches and a path passing through four R-switches. For example, in the connection state of FIG. 13, the path R1 passes through two R-switches 11a and 13a, but the path R2 passes through four R-switches 11b, 11c, 13b, and 13c.

As described above, there are two types of paths passing through different numbers of R-switches, but in the path passing through two R-switches, the length of the path connecting between the R-switch and the amplifier is appropriately determined so as to have the same path length as the path passing through four R-switches. For example, in the connection state of FIG. 13, when the path lengths from the divider 101 to the combiner 103 are added in order, the path length of the path R1 is L3+L1+(L1+L4+L5)+L2+(L1+L6+L7)+L1+L8=4L1+L2+L3+L4+L5+L6+L7+L8. The path length of the path R2 obtained similarly is L3+L1+L4+L1+L5+L2+L6+L1+L7+L7=4L1+L2+L3+L4+L5+L6+L8. Therefore, the paths R1 and R2 after the switching each have the same path length. The same applies also to the paths R3 and R4.

Note that, when the path length before the switching is compared with the path length after the switching, as described above, the lengths of the paths R1 to R4 before the switching are each 2L1+L2+L3+L5+L6+L8, while the lengths of the paths R1 to R4 after the switching are each 4L1+L2+L3+L4+L5+L6+L7+L8, and the length after the switching is larger by 2L1+L4+L7. On the other hand, in the first embodiment, the path length does not change before and after switching from the four paths passing merely through the active amplifiers to the four paths including the stand-by amplifier.

In this embodiment, the amplifiers are arranged in a linear manner, and the amplifiers arranged at both the ends are set as the stand-by amplifiers. When a problem occurs in any of the active amplifiers arranged between the stand-by amplifiers, such a bypass path that avoids two adjacent amplifiers including the failed active amplifier is established. Therefore, although there is a restriction of two adjacent amplifiers, a redundancy that can deal with problems of up to two active amplifiers can be performed. This embodiment represents a redundant configuration including four active amplifiers and two stand-by amplifiers, but it is possible to achieve a more general redundant configuration including n (n is a natural number of 3 or more) active amplifiers and two stand-by amplifiers, to thereby obtain a redundant amplifier that can deal with problems of up to two adjacent active amplifiers. Therefore, this embodiment is applicable also to an MPA in which the number of the amplifiers to be mounted is a power of 2, that is, 8, 16, . . . in principle.

This invention has been described by way of embodiments above, but this invention is not limited to the embodiments. A part or the entirety of the above-mentioned embodiments may be described by way of the following supplementary notes, but this invention is not limited to the following supplementary notes.

(Supplementary Note 1) A redundant amplifier, including:
a first switch including inputs P1, P2, . . . , and Pm and outputs Q1, Q2, . . . , and Qn, where m and n are natural numbers and m<n is satisfied, the first switch being configured to perform switching of connecting, on a one-to-one basis, the m inputs P1, P2, . . . , and Pm to m of the n outputs Q1, Q2, . . . , and Qn;
a second switch including inputs R1, R2, . . . , and Rn and outputs S1, S2, . . . , and Sm, the second switch being configured to perform switching of connecting, on a one-to-one basis, m of the n inputs R1, R2, . . . , and Rn to the m outputs S1, S2, . . . , and Sm; and
n same amplifiers A1, A2, . . . , and An connected on a one-to-one basis between the n outputs Q1, Q2, . . . , and Qn of the first switch and the n inputs R1, R2, . . . , and Rn of the second switch,
in which signal paths L1, L2, . . . , and Lm are formed in accordance with a connection state between an input and an output of each of the first switch and the second switch, the signal paths L1, L2, . . . , and Lm connecting the input P1 and the output S1, the input P2 and the output S2, . . . , and the input Pm and the output Sm, respectively, via any one of the n same amplifiers A1, A2, . . . , and An, and
in which the connection state has at least two types in which the signal paths L1, L2, . . . , and Lm each have the same length.

(Supplementary Note 2) A redundant amplifier according to supplementary note 1, in which the first switch and the second switch each include a plurality of waveguide switches connected to each other.

(Supplementary Note 3) A redundant amplifier according to supplementary note 2, in which the plurality of waveguide switches each include four ports and two waveguides capable of connecting two of the four ports to each other.

(Supplementary Note 4) A redundant amplifier according to supplementary note 2, in which the plurality of waveguide switches each include four ports and three waveguides capable of connecting two of the four ports to each other.

(Supplementary Note 5) A redundant amplifier according to supplementary note 1, in which a first signal path length, which is a signal path length in a first combination in which the signal paths L1, L2, . . . , and Lm each have the same length, is equal to a second signal path length, which is a signal path length in a second combination in which the signal paths L1, L2, . . . , and Lm each have the same length.

(Supplementary Note 6) A signal amplifying device, including:
the redundant amplifier according to any one of supplementary notes 1 to 5;
a divider for dividing an input signal into m signals, and inputting the m divided signals to inputs P1, P2, . . . , and Pm of a first switch on a one-to-one basis; and
a combiner for outputting a signal obtained by combining m signals input from outputs S1, S2, . . . . , and Sm of a second switch.

(Supplementary Note 7) A switching method for a redundant amplifier, including the steps of:
outputting m signals simultaneously input to a first switch from m outputs of a second switch, where m and n are natural numbers and m<n is satisfied, the m signals passing through a first signal path group including m signal paths that each have the same first path length and each pass through any one of predetermined m active system amplifiers of n amplifiers;
changing, when a problem occurs in at least one of the m active system amplifiers, a connection state between an input and an output of each of the first switch and the second switch, to thereby from a second signal path group including m signal paths that each have the same second path length and each pass through any one of active system amplifiers without a problem of the predetermined m active system amplifiers and predetermined (nm) redundant system amplifiers of then amplifiers; and
outputting m signals simultaneously input to the first switch from the respective m outputs of the second switch, the m signals passing through the second signal path group.

(Supplementary Note 8) A switching method for a redundant amplifier according to supplementary note 7, in which the first switch and the second switch each include a plurality of waveguide switches connected to each other.

(Supplementary Note 9) A switching method for a redundant amplifier according to supplementary note 8, in which the plurality of waveguide switches each include four ports and two waveguides capable of connecting two of the four ports to each other.

(Supplementary Note 10) A switching method for a redundant amplifier according to supplementary note 8, in which the plurality of waveguide switches each include four ports d three waveguides capable of connecting two of the four ports to each other.

(Supplementary Note 11) A switching method for a redundant amplifier according to supplementary note 7, in which the first signal path length is equal to the second signal path length.

(Supplementary Note 12) A switching method for a redundant amplifier according to any one of supplementary notes 7 to 11, in which the in signals simultaneously input to the first switch include signals divided from a single signal by a divider, and in which the in outputs of the second switch are combined into a single signal by a combiner.

REFERENCE SIGNS LIST 1, 100 signal amplifier
2, 10 redundant amplifier
3, 11 input switch
3a to 3g, 5a to 5g waveguide switch (C-switch)
4a to 4e, 12a to 12f amplifier
5, 13 output switch
11a to 11d, 13a to 13d waveguide switch (R-switch)
101 divider
102 combiner This application claims priority from Japanese Patent Application No. 2011-217346, filed on Sep. 30, 2011, the entire disclosure of which is incorporated herein by reference.

The invention claimed is:

1. A redundant amplifier, comprising:
a first switch for performing switching of connecting, on a one-to-one basis, m inputs (P1, P2, . . . , and Pm) to m of n outputs (Q1, Q2, . . . , and Qn), where m and n are natural numbers and m<n is satisfied, wherein the first switch comprises:
at least one first waveguide switch configured to connect an input of the m inputs to one of an amplifier and a second waveguide switch, and
at least one second waveguide switch configured to connect an input of the m inputs to one of a selected first waveguide switch of the at least one first waveguide switches and a selected third waveguide switch of an at least one third waveguide switches, wherein the at least one third waveguide switches are configured to connect at least one of the at least one first waveguide switches and at least one of the at least one second waveguide switches to an output of the n outputs;
a second switch for performing switching of connecting, on a one-to-one basis, m of n inputs (R1, R2, . . . , and Rn) to m outputs (S1, S2, . . . , and Sm);
n same amplifiers (A1, A2, . . . , and An) connected on a one-to-one basis between the n outputs (Q1, Q2, . . . , and Qn) of the first switch and the n inputs (R1, R2, . . . , and Rn) of the second switch;
a divider for dividing an input signal into m signals, and inputting the m divided signals to inputs (P1, P2, . . . , and Pm) of the first switch on a one-to-one basis; and
a combiner for outputting a signal obtained by combining m signals input from the outputs (S1, S2, . . . , and Sm) of the second switch,
wherein signal paths (L1, L2, . . . , and Lm) are formed in accordance with a connection state between an input and an output of each of the first switch and the second switch, the signal paths (L1, L2, . . . , and Lm) connecting respective inputs of the first switch to respective outputs of the second switch (P1 to S1, P2 to S2, . . . Pm to Sm) via any one of the n same amplifiers (A1, A2, . . . , and An), and
wherein the connection state has at least two types in which the signal paths (L1, L2, . . . , and Lm) each have the same length.

2. A redundant amplifier according to claim 1, wherein the first switch and the second switch each comprise a plurality of waveguide switches connected to each other.

3. A redundant amplifier according to claim 2, wherein the plurality of waveguide switches each comprise four ports and two waveguides capable of connecting two of the four ports to each other.

4. A redundant amplifier according to claim 2, wherein the plurality of waveguide switches each comprise four ports and three waveguides capable of connecting two of the four ports to each other.

5. A redundant amplifier according to claim 1, wherein a first signal path length, which is a signal path length in a first connection state in which the signal paths (L1, L2, . . . , and Lm) each have the same length, is equal to a second signal path length, which is a signal path length in a second connection state which is a connection state different from the first connection state and in which the signal paths (L1, L2, . . . , and Lm) each have the same length.

6. A switching method for a redundant amplifier, comprising the steps of:
outputting m signals simultaneously input to a first switch from m outputs of a second switch, where m and n are natural numbers and m<n is satisfied, the m signals passing through a first signal path group including m signal paths that each have the same first path length and each pass through any one of predetermined m active system amplifiers of n amplifiers, wherein the first switch comprises:
at least one first waveguide switch configured to connect an input of the m inputs to one of an amplifier and a second waveguide switch, and
at least one second waveguide switch configured to connect an input of the m inputs to one of a selected first waveguide switch of the at least one first waveguide switches and a selected third waveguide switch of an at least one third waveguide switches, wherein the at least one third waveguide switches are configured to connect at least one of the at least one first waveguide switches and at least one of the at least one second waveguide switches to an output of the n outputs;
changing, when a problem occurs in at least one of the m active system amplifiers, a connection state between an input and an output of each of the first switch and the second switch, to thereby from a second signal path group including m signal paths that each have the same second path length and each pass through any one of active system amplifiers without a problem of the predetermined m active system amplifiers and predetermined (n−m) redundant system amplifiers of the n amplifiers; and
outputting m signals simultaneously input to the first switch from the respective m outputs of the second switch, the m signals passing through the second signal path group,
wherein the m signals simultaneously input to the first switch comprise signals divided from a single signal by a divider, and
wherein the m outputs of the second switch are combined into a single signal by a combiner.

7. A switching method for a redundant amplifier according to claim 6, wherein the first switch and the second switch each comprise a plurality of waveguide switches connected to each other.

8. A switching method for a redundant amplifier according to claim 6, wherein the first signal path length is equal to the second signal path length.

* * * * *